United States Patent [19]

Takahashi

[11] Patent Number: 5,039,589
[45] Date of Patent: Aug. 13, 1991

[54] LIGHT-SENSITIVE MATERIAL CONTAINING SILVER HALIDE, REDUCING AGENT, POLYMERIZABLE COMPOUND AND BASE PRECURSOR DISPERSED IN THE POLYMERIZABLE COMPOUND

[75] Inventor: Ryuichi Takahashi, Kanagawa, Japan

[73] Assignee: Fuji Photo Film Co., Ltd., Kanagawa, Japan

[21] Appl. No.: 540,731

[22] Filed: Jun. 20, 1990

[30] Foreign Application Priority Data

Jun. 22, 1989 [JP] Japan ................................ 1-160148

[51] Int. Cl.$^5$ ........................ G03C 1/68; G03C 1/72
[52] U.S. Cl. .................................. 430/138; 430/203; 430/281; 430/617; 430/619
[58] Field of Search ............... 430/138, 203, 281, 617, 430/619

[56] References Cited

U.S. PATENT DOCUMENTS

| | | | |
|---|---|---|---|
| 4,514,493 | 4/1985 | Hirai et al. | 430/203 |
| 4,760,011 | 7/1988 | Kakimi | 430/138 |
| 4,833,062 | 5/1989 | Kakimi | 430/138 |
| 4,842,977 | 6/1989 | Kakimi | 430/138 |
| 4,871,641 | 10/1989 | Kakimi | 430/138 |
| 4,897,335 | 1/1990 | Kakimi | 430/203 |
| 4,912,011 | 3/1990 | Yamamoto et al. | 430/138 |
| 4,939,064 | 7/1990 | Nakamura | 430/138 |
| 4,954,417 | 9/1990 | Nakamura et al. | 430/138 |

FOREIGN PATENT DOCUMENTS

| | | | |
|---|---|---|---|
| 237054 | 9/1987 | European Pat. Off. | 430/138 |
| 247396 | 12/1987 | European Pat. Off. | 430/138 |
| 2199153 | 6/1988 | United Kingdom | 430/138 |
| 2204960 | 11/1988 | United Kingdom | 430/138 |

Primary Examiner—Charles L. Bowers, Jr.
Assistant Examiner—Patrick A. Doody
Attorney, Agent, or Firm—Sughrue, Mion, Zinn, Macpeak & Seas

[57] ABSTRACT

A light-sensitive material comprising a support and a light-sensitive layer provided thereon is disclosed. The light-sensitive layer contains silver halide, a reducing agent, an ethylenically unsaturated polymerizable compound and a base precursor composed of a salt of a carboxylic acid with an organic base. The silver halide, reducing agent, polymerizable compound and base precursor are contained in microcapsules which are dispersed in the light-sensitive layer. The microcapsules are obtained by (1) dispersing the base precursor in water, (2) emulsifying the resulting dispersion in the polymerizable compound, (3) further emulsifying the resulting emulsion in an aqueous medium containing a nonionic water-soluble polymer and (4) forming the shell of the microcapsules. It is preferred that the base precursor is dispersed in water in the presence of a nonionic water-soluble polymer or an amphoteric water-soluble polymer, and the resulting dispersion is emulsified in the polymerizable compound.

10 Claims, 2 Drawing Sheets

LIGHT-SENSITIVE MATERIAL CONTAINING SILVER HALIDE, REDUCING AGENT, POLYMERIZABLE COMPOUND AND BASE PRECURSOR DISPERSED IN THE POLYMERIZABLE COMPOUND

FIELD OF THE INVENTION

The present invention relates to a light-sensitive material comprising a support and a light-sensitive layer provided thereon which contains microcapsules containing silver halide, a reducing agent, a polymerizable compound and a base precursor composed of a salt of a carboxylic acid with an organic base.

BACKGROUND OF THE INVENTION

A light-sensitive material containing silver halide, a reducing agent and a polymerizable compound is disclosed in Japanese Patent Publications No. 45(1970)-11149 (corresponding to U.S. Pat. No. 3,697,275), No. 47(1972)-20741 and No. 49(1974)-10697 (corresponding to U.S. Pat. No. 3,746,542). The light-sensitive material is used in an image-forming method comprising polymerizing a polymerizable compound by action of a reducing agent within the area where a latent image of silver halide has been formed. The method disclosed in the publications employs a wet development process.

An improved image-forming method employing a dry process has also been proposed in Japanese Patent Provisional Publications No. 61(1986)-69062 and No. 61(1986)-73145 (the contents of both publications are described in U.S. Pat. No. 4,629,676 and European Patent Provisional Publication No. 0174634A). In the method, a recording material (light-sensitive material) comprising a support and a light-sensitive layer provided thereon which contains a light-sensitive silver salt (silver halide), a reducing agent, a cross-linkable compound (a polymerizable compound), a binder and a color image forming substance is imagewise exposed to light to form a latent image, and then heated to polymerize the polymerizable compound within the area where a latent image of the silver halide has been formed.

There is further proposed another image-forming method in which the polymerizable compound is polymerized within the area where a latent image of the silver halide has not been formed. This method is described in Japanese Patent Provisional Publication No. 61(1986)-243449 (corresponding to European Patent Provisional Publication No. 0202490A). In the method, the polymerization of the polymerizable compound is inhibited within the area where a latent image of the silver halide has been formed, and the polymerization of the polymerizable compound is accelerated within the other area (i.e., the area where the latent image has not been formed).

The image-forming method using the above-mentioned light-sensitive material generally comprises the steps of imagewise forming a polymer image on the light-sensitive material, pressing the light-sensitive material on an image-receiving material having an image-receiving layer to transfer the unpolymerized polymerizable compound to the image-receiving material so as to obtain a transferred image on the image-receiving material. In this method, the silver halide and the polymerizable compound in the light-sensitive material are preferably contained in microcapsules (i.e., light-sensitive microcapsules). The light-sensitive microcapsules are described in Japanese Patent Provisional Publications No. 61(1986)-275742 and No. 61(1986)-278849 (contents of both publications are described in European Patent Provisional Publication No. 0203613A). Employing the light-sensitive microcapsules, an image of high quality can be obtained.

As the shell material of the microcapsules, a variety of resins have been proposed, for example, in Japanese Patent Provisional Publications No. 62(1987)-209438 (corresponding to U.S. Pat. No. 4,888,265), 62(1987)-209439 (corresponding to U.S. Pat. No. 4,833,062) and No. 63(1988)-269146 (corresponding to U.S. Pat. No. 4,880,721). Further, in the preparation of microcapsules, a specific protective colloid (a mixture of pectin and a styrenesulfonic acid polymer) can be used, as is described in Japanese Patent Provisional Publication No. 63(1988)-121837 (corresponding to U.S. Pat. No. 4,842,978).

On the other hand, the development and the polymerization reactions in the above-mentioned image-forming methods smoothly proceed under alkaline conditions. Accordingly, the light-sensitive layer of the light-sensitive material preferably contains a base or a base precursor as an image forming accelerator. A light-sensitive material containing a base or a base precursor in the light-sensitive layer is described in Japanese Patent Provisional Publication No. 62(1987)-264041 (corresponding to European Patent Provisional Publication No. 0219087A).

Furthermore, a light-sensitive material in which a base precursor is contained in the light-sensitive microcapsules is described in Japanese Patent Provisional Publication No. 64(1989)-32251 (corresponding to European Patent Provisional Publication No. 0301539A and copending U.S. patent application Ser. No. 07/225,456, filed 07/28/88 now, U.S. Pat. No. 4,939,064. In the case that the base or base precursor is contained in the light-sensitive microcapsules, the image forming reaction is directly and effectively accelerated by the base or base precursor. According to the invention of Japanese Patent Provisional Publication No. 64(1989)-32251, the solid particles of the base precursor are directly dispersed in the polymerizable compound.

The light-sensitive material proposed in Japanese Patent Provisional Publication No. 64(1989)-32251 is highly advantageous, but further improvement is desired. For example, the base precursor is not completely kept within a core material (i.e., oily liquid containing the polymerizable compound) of the microcapsules in preparation of the microcapsules. Further, the base precursor partially moves from the core material to an aqueous medium outside of the microcapsules. The base precursor in the aqueous medium inhibits the encapsulation reaction. Therefore, the resulting microcapsules have a reduced denseness of the microcapsule shell, and the core material is not kept within the microcapsules. As a result, the core material oozes out of the microcapsule at the development process, and the maximum density in the image portion is thus decreased (namely, the amount of the unpolymerized polymerizable compound transferred from the microcapsules to an image-receiving material is decreased). Further, the minimum density in the background portion is increased (namely, the white background is slightly colored). The oozed polymerizable compound is not sufficiently polymerized because the compound is exposed to air, which functions as a polymerization inhibitor.

SUMMARY OF THE INVENTION

In order to solve the above-mentioned problems, an improved light-sensitive material is proposed in Japanese Patent Provisional Publication No. 2(1990)-146041 (corresponding to copending U.S. patent application Ser. No. 07/401,304), now abandoned. According to the invention of Japanese Patent Provisional Publication No. 2(1990)-146041, an aqueous dispersion of the solid particles of the base precursor is added to the polymerizable compound in preparation of the light-sensitive material. Using the aqueous dispersion of the solid particles of the base precursor, the base precursor is prevented from moving into the aqueous medium and the denseness of the microcapsule shell is improved.

The present inventor has further studied the light-sensitive material proposed in Japanese Patent Provisional Publication No. 2(1990)-146041.

An object of the present invention is to provide a further improved light-sensitive material, which gives an image of high contrast.

Another object of the invention is to provide a light-sensitive material by firmly keeping a base precursor within the core material of microcapsules.

A further object of the invention is to provide a light-sensitive material containing microcapsules which have a dense shell material and are highly resistant to damage.

The present invention provides a light-sensitive material comprising a support and a light-sensitive layer provided thereon which contains silver halide, a reducing agent, an ethylenically unsaturated polymerizable compound and a base precursor composed of a salt of a carboxylic acid with an organic base, said silver halide, reducing agent, polymerizable compound and base precursor being contained in microcapsules which are dispersed in the light-sensitive layer, wherein the microcapsules are obtained by (1) dispersing the base precursor in water, (2) emulsifying the resulting dispersion in the polymerizable compound, (3) further emulsifying the resulting emulsion in an aqueous medium containing a nonionic water-soluble polymer and (4) forming the shell of the microcapsules.

In the course of the studies of the light-sensitive material proposed in Japanese Patent Provisional Publication No. 2(1990)-146041, the present inventor notes that the base precursor composed of a salt is partially dissolved in the aqueous medium outside of the core material. The partially dissolved base precursor is eluted out of the microcapsules when the aqueous medium contains an anionic water-soluble polymer. Consequently, the mechanical strength of the microcapsule shell is decreased, and thereby the light-sensitive material tends to be easily damaged in the process for preparation or the process for image formation. When such damaged light-sensitive material is used at the heat development process, the core material easily oozes out of the microcapsule to decrease the contrast of the obtained image.

According to the present invention, the aqueous medium contains a nonionic water-soluble polymer for preparing the microcapsules. The present inventor notes that the base precursor is dissolved in an aqueous medium at the process of emulsifying the polymerizable compound in the aqueous medium in preparation of microcapsules, if the aqueous medium contains a large amount of the anionic or cationic polymer. The present inventor has further noted that the base precursor is not dissolved in an aqueous medium containing a nonionic water-soluble polymer, and the base precursor is firmly kept within the core material. Accordingly, the encapsulation reaction of the shell material is not inhibited. Therefore, the microcapsules of the present invention have a high denseness, and the light-sensitive material of the invention is highly resistant to damage.

As is mentioned above, the base precursor is firmly kept within microcapsules at the process for preparation of microcapsules according to the invention. Consequently, the core material is also firmly kept within the microcapsules at the heat development process. Therefore, the light-sensitive material of the present invention gives an image of high contrast.

In the present invention, it is preferred that the base precursor is dispersed in an aqueous solution of a nonionic or amphoteric water-soluble polymer and then the resulting dispersion is emulsified in the polymerizable compound. Using the nonionic or amphoteric water-soluble polymer, the base precursor is furthermore prevented from moving into the aqueous medium.

DETAILED DESCRIPTION OF THE INVENTION

According to the present invention, the light-sensitive microcapsules are obtained by (1) dispersing the base precursor in water, (2) emulsifying the resulting dispersion in the polymerizable compound, (3) further emulsifying the resulting emulsion in an aqueous medium containing a nonionic water-soluble polymer and (4) forming the shell of the microcapsules.

Figure 1:
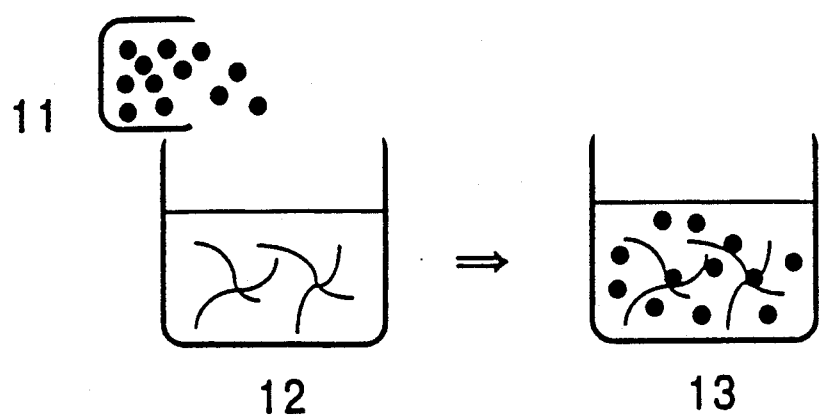
FIG. 1 schematically illustrates the step (1) of dispersing the base precursor in water.

FIG. 1 schematically illustrates the step (1) of dispersing the base precursor in water.

A base precursor (11) in the form of solid particles is added to water (12). A nonionic or amphoteric water-soluble polymer is preferably dissolved in the water (12). The mixture is then stirred to obtain an aqueous dispersion of the base precursor (13).

Figure 2:
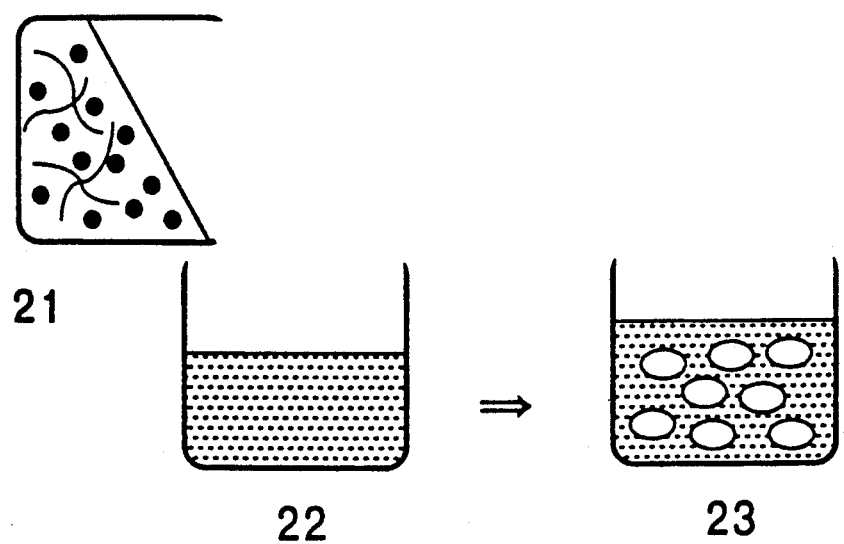
FIG. 2 schematically illustrates the step (2) of emulsifying the resulting dispersion in the polymerizable compound.

FIG. 2 schematically illustrates the step (2) of emulsifying the resulting dispersion in the polymerizable compound.

The aqueous dispersion of the base precursor (21) is poured into a polymerizable compound (22) which is an oily phase. The mixture is then stirred to obtain an oily emulsion (23).

Figure 3:
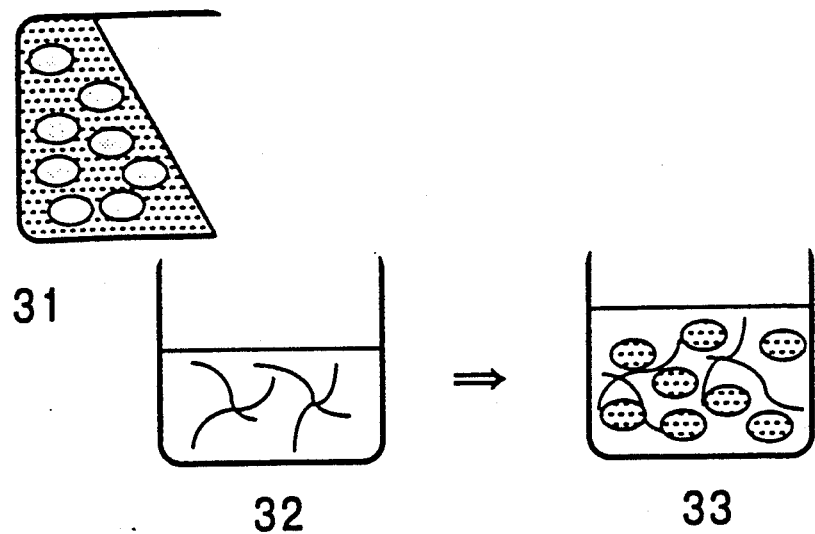
FIG. 3 schematically illustrates the step (3) of further emulsifying the resulting emulsion in an aqueous medium containing a nonionic water-soluble polymer.

FIG. 3 schematically illustrates the step (3) of further emulsifying the resulting emulsion in an aqueous medium.

The oily emulsion (31) is poured into an aqueous medium containing a nonionic water-soluble polymer (32). The mixture is then stirred to obtain an aqueous emulsion (33).

Figure 4:
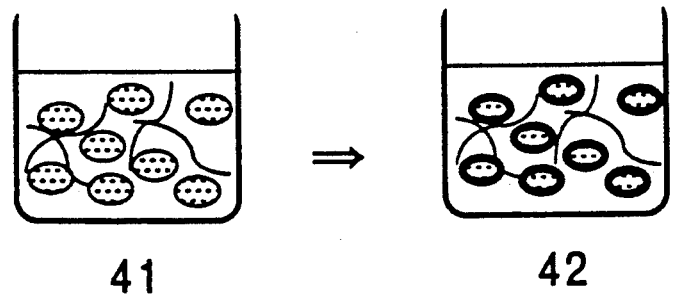
FIG. 4 schematically illustrates the step (4) of forming the shell of the microcapsules.

FIG. 4 schematically illustrates the step (4) of forming the shell of the microcapsules.

The shell is formed on the surface of the oily droplets contained in the aqueous emulsion (41) to obtain a dispersion of microcapsules (42).

In preparation of the light-sensitive material of the invention, the other components such as silver halide and a reducing agent are preferably added to the polymerizable compound at the step (2) to be contained in the microcapsules.

In order to prevent the base precursor from moving into water, a nonionic water-soluble polymer or an amphoteric water-soluble polymer (which is apparently neutralized in the electric charge) is preferably used in the step (1) of dispersing the base precursor in water.

Examples of the nonionic water-soluble polymers include polyvinyl alcohol, polyvinyl pyrrolidone, polyacrylamide, polymethyl vinyl ether, polyacryloyl morpholine, polyhydroxyethyl acrylate, copolymer of hydroxyethyl methacrylate and acrylamide, hydroxyethyl cellulose, hydroxypropyl cellulose and methyl cellulose.

An example of the amphoteric water-soluble polymer is gelatin.

The water-soluble polymer is preferably contained in an amount of 0.1 to 100% by weight, more preferably 1 to 50% by weight, based on the amount of the base precursor. The base precursor is preferably contained in an amount of 5 to 60% by weight, more preferably 10 to 50% by weight, based on the total amount of the dispersion. Further, the base precursor is preferably used in an amount of 2 to 50% by weight, more preferably 5 to 30% by weight, based on the amount of the polymerizable compound.

According to the present invention, a nonionic water-soluble polymer is dissolved in an aqueous medium at the step (3) of emulsifying the hydrophobic (oily) core material containing a polymerizable compound in an aqueous medium. The nonionic water-soluble polymer is preferably is dissolved in the aqueous medium in an amount of 0.1 to 30% by weight, more preferably 1 to 20% by weight. The amount of the polymerizable compound is preferably in the range of 10 to 120% by weight, more preferably 20 to 90% by weight, based on the amount of the aqueous medium.

Examples of the nonionic water-soluble polymer include polyvinyl alcohol, polyvinyl pyrrolidone, polyacrylamide, polymethyl vinyl ether, polyacryloyl morpholine, polyhydroxyethyl acrylate, polyhydroxyethyl methacrylate-acrylamide copolymer, hydroxyethyl cellulose, hydroxypropyl cellulose, methyl cellulose.

For the purpose of efficiently emulsifying the hydrophobic core material containing the polymerizable compound in an aqueous medium in the form of extremely small sized droplets and preventing agglomeration or coalescence of the droplets, an anionic water-soluble polymer is preferably used in combination with the above-mentioned nonionic water-soluble polymer in such a small amount that the base precursor is not dissolved in the aqueous medium containing the anionic water soluble polymer. In the case of using the anionic water-soluble polymer in combination with the nonionic water-soluble polymer, the amount of the anionic water-soluble polymer contained in the aqueous medium is preferably in the range of 0.01 to 5% by weight, more preferably 0.1 to 2% by weight to prevent the base precursor from being dissolved in the anionic water-soluble polymer.

Examples of the anionic water-soluble polymers include polystyrenesulfinate, copolymer of styrenesulfinate, polystyrenesulfonate, copolymer of styrenesulfonate, polyvinylsulfate, polyvinylsulfonate, copolymer of maleic anhydride and styrene and copolymer of maleic anhydride and isobutylene.

It is particularly preferred to use a small amount of a water-soluble polymer having a sulfinyl group in combination with the nonionic water-soluble polymer.

As the shell material of the light-sensitive microcapsule according to the invention, an amino-aldehyde resin is preferably used. The amino-aldehyde resin is described in U.S. Pat. Nos. 4,001,140, 4,087,376, 4,089,802 and 4,025,455.

Examples of the amino-aldehyde resins include urea-formaldehyde resin, urea-formaldehyde resorcinol resin, melamine-formaldehyde resin, acetoguanamine-formaldehyde resin and benzoguanamine-formaldehyde resin. Melamine-formaldehyde resin is particularly preferred because microcapsules of high denseness can be obtained.

In the case of using aldehyde type microcapsules in the invention, the aldehyde residue preferably is small as possible.

The mean size of the microcapsules preferably ranges from 3 to 20 μm. Further, the microcapsules preferably have a uniform particle distribution. The thickness of the microcapsule shell is preferably in a certain range based on the particle size of the microcapsule.

In the case of incorporating silver halide into the microcapsules, the mean grain size of the silver halide preferably is not more than 1/5, more preferably not more than 1/10, of the mean particle size of the microcapsules. When the mean grain size of the silver halide grains is not more than 1/5 of the mean particle size of the microcapsules, an even and uniform image can be obtained.

The base precursor used in the present invention is composed of a salt of a carboxylic acid with an organic base. The following base precursor (a) or (b) is preferably employed.

A base precursor (a) is composed of a salt of a carboxylic acid and an organic base, wherein the organic base is a diacidic to tetraacidic base composed of two to four amidine moieties and at least one residue of a hydrocarbon or a heterocyclic ring as a linking group for the amidine moieties, said amidine moiety corresponding to an atomic group formed by removing one or two hydrogen atoms from an amidine having the following formula (1).

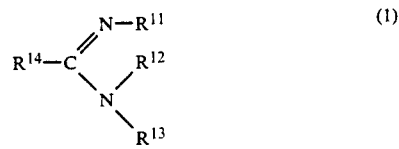

(1)

In the formula (1), each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any of $R^{11}$, $R^{12}$, $R^{13}$ and $R^{14}$ may be combined together to form a five-membered or six-membered nitrogen-containing heterocyclic ring.

A base precursor (b) is composed of a salt of a carboxylic acid and an organic base, wherein the organic base is a diacidic to tetraacidic base which is composed of two to four guanidine moieties and at least one residue of a hydrocarbon or a heterocyclic ring as a linking group for the guanidine moieties, the number of carbon atoms contained in said organic base being not more than six times the number of the guanidine moieties, and said guanidine moiety corresponding to an atomic group formed by removing one or two hydrogen atoms from a compound having the following formula (2).

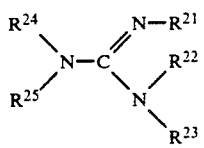
(2)

In the formula (2), each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any of $R^{21}$, $R^{22}$, $R^{23}$, $R^{24}$ and $R^{25}$ may be combined together to form a five-membered or six-membered nitrogen-containing heterocyclic ring.

The base precursor preferably is in the form of solid particles having a mean particle size in the range of 0.01 to 30 μm (more preferably 0.05 to 5 μm).

Silver halide, a reducing agent, a polymerizable compound and a support which constitute a light-sensitive material are described below in detail.

Examples of the silver halide employable for the light-sensitive material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described Japanese Patent Provisional Publications No. 57(1982)-154232, No. 58(1983)-108533, No. 59(1984)-48755 and No. 59(1984)-52237, U.S. Pat. No. 4,433,048, and European Patent No. 100,984. A silver halide grain having a core/shell structure in which the silver iodide content in the shell is higher than that in the core can also be employed.

There is no specific limitation on the crystal habit of silver halide grains. For example, a tubular grain having an aspect ratio of not less than 3 can be used.

It is preferred to use silver halide grains having a relatively low fogging value.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed.

The silver halide grains preferably have a mean grain (or particle) size of 0.001 to 5 μm, more preferably 0.001 to 2 μm.

The amount of the silver halide grains contained in the light-sensitive layer preferably is in the range of 0.1 mg/m² to 10 g/m² in terms of silver contained in the silver halide and an organic silver salt which is one of optional components. The amount of the silver halide contained in the light-sensitive layer preferably is not more than 1 g/m²m, more preferably in the range of 1 to 500 mg/m², in terms of silver contained only in the silver halide.

The reducing agent employable in the light-sensitive material has a function of reducing the silver halide and/or a function of accelerating or restraining polymerization of the polymerizable compound. There are various known reducing agents having the above-mentioned function. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonoamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the nature or amount of the reducing agent, the polymerizable compound can be polymerized within the area where a latent image of the silver halide has been formed or the area where a latent image of the silver halide has not been formed. In the case that the polymerizable compound is polymerized within the area where the latent image of the silver halide has not been formed, 1-phenyl-3-pyrazolidone is preferably employed as the reducing agent.

Various reducing agents having the above-mentioned functions (including compounds referred to as developing a agent, hydrazine derivative) are described in Japanese Patent Provisional Publications No. 61(1986)-183640, No. 61(1986)-183535, No. 61(1986)-228441, No. 62(1987)-70836, No. 61(1987)-86353, No. 62(1987)-86355, No. 62(1987)-264041 and No. 62(1987)-198849. These reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978). Further, a precursor of a reducing agent capable of releasing a reducing agent under heating or in contact with a base can be used in place of the reducing agent. In the light-sensitive material of the invention, various reducing agents and precursors thereof can be effectively employed. Thus, "the reducing agent(s)" in the present specification includes all of the reducing agents and reducing agent precursors described in the above publications.

The reducing agents can be used singly or in combination. In the case that two or more reducing agents are used in combination, certain interactions between the reducing agents may be expected. One of the interactions is the acceleration of reduction of silver halide (and/or an organic silver salt) through so-called super-additivity. Another interaction is for a chain reaction in which an oxidized state of one reducing agent formed by a reduction of silver halide (and/or an organic silver salt) induces or inhibits the polymerization of the polymerizable compound via oxidation-reduction reaction with another reducing agent. Both interactions may occur simultaneously. Thus, it is difficult to determine which of the interactions has occurred in practical use.

Concrete examples of the above-mentioned reducing agents include pentadecylhydroquinone, 5-t-butylcatechol, p-(N,N-diethylamino)phenol, 1-phenyl-3-pyrazolidone, 5-phenyl-3-pyrazolidone, 1-phenyl-4- methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-tbutyl-5-hexadecyloxyphenol, 2-(N-butylcarbamoyl)-4-phenylsulfonylaminonaphthol, 2-(N-methyl-N-octadecylcarbamoyl)-4-sulfonylaminonaphthol, 1-formyl-2(2-methoxyphenyl)hydrazine, 1-formyl-2-(buthoxyphenyl)hydrazine, 1-(3,5-dichlorobenzoyl)- 2-phenylhydrazine, 1-(3,5-dichlorobenzoyl)-2-(2-chlorophenyl)-hydrazine, 1-acetyl-2-phenylhydrazine, 1-acetyl-2-{(p- or o-)aminophenyl}hydrazine, 1-formyl-2-{(p- or o-)aminophenyl}hydrazine, 1-acetyl-2-{(p- or o-)methoxyphenyl}hydrazine, 1-formyl-2-{(p- or o-)aminophenyl}hydrazine, 1-acetyl-2-{(p or o-)aminophenyl} hydrazine, 1-lauroyl-2-{(p- or o-)aminophenyl}hydrazine, 1-trityl-2-(2,6-dichloro-4-cyanophenyl)hydrazine, 1-trityl-2-phenylhydrazine, 1-phenyl-2-(2,4,6-trichlorophenyl) hydrazine, 1-{2-(2,5-di-tert-pentyl-phenoxy)butyloyl}-2-(p- or o-)aminophenyl)hydrazine, 1-{2-(2,5-di-t-pentylphenoxy) butyloyl}-2-{(p- or o-)aminophenyl}hydrazine, pentadecylfluorocaprylate, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-{(p- or o-)methoxyphenyl} hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy) butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl) hydrazine, 1-trityl-2-[{2-(N-ethyl-N-octylsulfamoyl)-4-methanesulfonyl} phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive material preferably ranges from 0.1 to 1,500 mole % based on 1 mole of silver (including the above-mentioned silver halide and the optional organic silver salt).

There is no specific limitation with respect to the polymerizable compound, except that the polymerizable compound has an ethylenic unsaturated group. If a heat development process is to be performed in the use of the light-sensitive material, a compound having a relatively high boiling point (e.g., 80 ° C. or higher) that hardly evaporates upon heating is preferably employed as the polymerizable compound. When the light-sensitive layer contains a color image-forming substance (optional component, described later), the polymerizable compound preferably is a cross-linkable one having plural polymerizable groups in the molecule, because such a cross-linkable compound favorably serves for fixing the color image-forming substance in the course of polymerization-hardening of the polymerizable compound.

Examples of the compound having an ethylenic unsaturated group which can be used for the light-sensitive material include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives, vinyl ethers, vinyl esters, N-vinyl heterocyclic compounds, allyl ethers, allyl esters, and derivatives thereof.

Concrete examples of the acrylic esters include n-butyl acrylate, cyclohexyl acrylate, 2.ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropionaldehyde and pentaerythritol condensate, triacrylate of propyleneoxide addition product of trimethylolpropane, polyacrylate of hydroxypolyether, polyester acrylate and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate , pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds wherein a polymerizable functional group such as a vinyl group or a vinylidene group is introduced into a chemical structure of the above-mentioned reducing agent or into a chemical structure of the optional color image-forming substance are also employed as the polymerizable compound. Light-sensitive materials using compounds which function as both the reducing agent and the polymerizable compound or both the color image-forming substance and the polymerizable compound are also included in embodiments of the light-sensitive material of the invention.

The amount of the polymerizable compound in the light-sensitive material preferably ranges from 5 to 120,000 parts by weight, more preferably from 12 to 12,000 parts by weight, per one part by weight of the silver halide.

The light-sensitive material can be prepared by arranging a light-sensitive layer containing the above-mentioned components on a support. There is no specific limitation with respect to the support. When heat is used to develop the light-sensitive material, a material for the support preferably is resistant to heat applied in the development stage. Examples of the material employable for the preparation of the support include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has a certain smoothness as described in Japanese Patent Provisional Publication No. 62(1987)-209529 (corresponding to U.S. Pat. No. 4,883,738 and European Patent Provisional Publication No. 0237048A). As the paper support, there can be employed various paper supports such as a paper support having a low water absorption described in Japanese Patent Provisional Publication No. 63(1988)-38934 (corresponding to U.S. Pat. No. 4,871,642 and European Patent Provisional Publication No. 0256381A); a paper support having a certain Bekk Smoothness described in Japanese Patent Provisional Publication No. 63(1988)-47754 (corresponding to U.S. Pat. No. 4,814,252); a paper support having a low shrinkage ratio described in Japanese Patent Provisional Publication No. 63(1988)-81339 (corresponding to U.S. Pat. No. 4,865,941); and a paper support having a pH value of 5 to 9 described in Japanese Patent Provisional Publication No. 63(1988)-97941 (corresponding to U.S. Pat. No. 4,902,600).

Various components which may be optionally contained in the light-sensitive layer and auxiliary layers which may be optionally arranged on the light sensitive layer are described below.

Examples of the optional components which may be contained in the light-sensitive layer include color image-forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, anti-halation dyes or pigments, antiirradiation dyes or pigments, dyes decolored by irradiation with light, matting agents, antismudging agents, plasticizers, water releasers, binders, photopolymerization initiators, solvents of the polymerizable compound, and water-soluble vinyl polymers.

In the light-sensitive material, a polymer image can be obtained on the light-sensitive layer having the above-mentioned constitution. Further, a color image can be obtained on the light-sensitive layer by incorporating a color image-forming substance as an optional component into the light-sensitive layer.

There is no specific limitation with respect to the color image-forming substance, and various kinds of substances can be employed. Examples of the color image-forming substance include a colored substance (i.e., dyes and pigments) and a non-colored or almost non-colored substance (i.e., color former or dye- or pigment-precursor) which develops to give a color under application of external energy (e.g., heating, pressing, or light irradiation) or by contact with other components (i.e., developer). Examples of dyes and pigments (i.e., colored substance) employable in the invention include commercially available ones as well as various known compounds described in the technical publications, for example, Yuki Gosei Kagaku Kyokai (ed.), "Handbook of Dyes (written in Japanese, 1970)" and Nippon Ganryo Gijutsu Kyokai (ed.,), "New Handbook of pigments (written in Japanese, 1977)". Those dyes and pigments can be used in the form of a solution or a dispersion.

Examples of the substances which develop to give a color under application of energy (e.g., heating, pressing, light irradiation) include thermochromic compounds, piezochromic compounds, photochromic compounds and leuco compounds derived from triarylmethane dyes, quinone dyes, indigoid dyes, azine dyes. Those compounds can develop to give a color by heating, application of pressure, light-irradiation or air-oxidation.

Examples of the substances which develop to give a color in contact with other components include various compounds capable of developing a color through a reaction between two or more components, such as an acid-base reaction, oxidation-reduction reaction, coupling reaction, chelating reaction, and the like. Examples of color formation systems are described in Hiroyuki Moriga, "Introduction of Chemistry of Speciality Paper (in Japanese, 1975)", pp. 29–58 (pressure-sensitive copying paper), pp. 87–95 (azography), pp. 118–120 (heat-sensitive color formation by chemical change) or in MSS. of the seminar promoted by the Society of Kinki Chemical Industry, "The Newest Chemistry of Coloring Matter-Attractive Application and New Development as a Functional Coloring Matter", pp. 26–32 (June 19, 1980). Examples of the color formation systems specifically include a color formation system used in pressure-sensitive papers comprising a color former having a partial structure of lactone, lactam, spiropyran, and an acidic substance (developer), e.g., acid clay, phenol; a system utilizing azo-coupling reaction between an aromatic diazonium salt, diazotate or diazosulfonate and naphthol, aniline, active methylene; a system utilizing a chelating reaction, such as a reaction between hexamethylenetetramine and a ferric ion and gallic acid, or a reaction between a phenolphthalein complexion and an alkaline earth metal ion; a system utilizing oxidation-reduction reaction, such as a reaction between ferric stearate and pyrogallol, or a reaction between silver behenate and 4-methoxy-1-naphthol.

The color image-forming substance is preferably used in an amount of 0.5 to 50 parts by weight, more preferably 2 to 30 parts by weight, per 100 parts by weight of the polymerizable compound. When a developer is employed, the amount of the developer is preferably in the range of about 0.3 to 80 parts by weight per one part by weight of the color former.

In the case of using two kinds of color image-forming substances which give a color when they are brought into contact with each other (e.g., color former and a developer), one substance and the polymerizable compound are contained in the microcapsule, and the other is arranged outside of the microcapsule in the light-sensitive layer, whereby a color image can be formed on the light-sensitive layer.

There is no specific limitation with respect to the nature of the sensitizing dye, and any known sensitizing dyes used in the conventional photographic art may be employed in the light-sensitive material. Examples of the sensitizing dyes include methine dyes, cyanine dyes, merocyanine dyes, complex cyanine dyes, holopolar cyanine dyes, hemicyanine dyes, styryl dyes and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but exhibits supersensitizing activity can be used. The amount of the sensitizing dye to be added generally ranges from approx. $10^{-8}$ to $10^{-2}$ mole per 1 mole of the silver halide.

The sensitizing dye is preferably added in the stage of preparing the silver halide emulsion.

Addition of an organic silver salt to the light-sensitive material is particularly effective for the heat development process. It is presumed that the organic silver salt takes part in a redox reaction using a silver halide latent image as a catalyst when it is heated to a temperature of 80° C. or higher. In such case, the organic silver salt is preferably positioned in contact with the silver halide or close to the silver halide. Examples of organic compounds employable for forming such organic silver salts include aliphatic or aromatic carboxylic acids, thiocarbonyl group-containing compounds having a mercapto group or an α-hydrogen atom, and imino group-containing compounds. Of these, benzotriazole is particularly preferred. The organic silver salt is generally used in an amount of from 0.01 to 10 moles, preferably from 0.01 to 1 mole, per 1 mole of the silver halide. Instead of the organic silver salt, an organic compound (e.g., benzotriazole) which can form an organic silver salt in combination with an inorganic silver salt may be incorporated into the light-sensitive layer to obtain the same effect. The above-mentioned organic silver salt is preferably used in an amount of 0.1 to 10 moles, more preferably 0.01 to 1 mole, per 1 mole of the silver halide.

A radical generator which takes part in polymerization acceleration (or polymerization inhibition) by the reducing agent may be contained in the light-sensitive layer. Examples of the radical generator include triazene silver, silver diazotate and an azo compound.

Various image formation accelerators are employable in the light-sensitive material. The image formation accelerators accelerate the oxidation-reduction reaction between a silver halide (and/or an organic silver salt) and a reducing agent, accelerate emigration of an image forming substance from a light-sensitive layer to an image-receiving material (described hereinafter) or an image-receiving layer (described hereinafter), or an image-receiving layer (described hereinafter), or provide a similar function. The image formation accelerators can be classified into bases, base precursors (described before), oils, surface active agents, compounds functioning as an anti-fogging agent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often exhibits a plurality of functions.

Examples of the image formation accelerators are given below.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts and polyalkylene oxides.

The compounds functioning as an anti-fogging agent and/or a development accelerator can be used for the purpose of obtaining an image of high sharpness having a high maximum density and a low minimum density (i.e., an image having high S/N ratio). Examples of the compounds functioning as an anti-fogging agent and/or a development accelerator include a conventional anti-fogging agent, a compound having a cyclic amido structure, a thioether compound, a polyethylene glycol derivative, a thiol derivative, an acetylene compound, a sulfonamide derivative and a salt of quaternary ammonium.

The hot-melt solvent preferably is a compound which may be used as a solvent of the reducing agent or a compound which has a high dielectric constant and can accelerate physical development of silver salts. Examples of preferred hot-melt solvents include polyethylene glycols, derivatives of polyethylene oxides (e.g., oleate ester), bees-wax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26-28 (December 1976).

The compounds functioning as an antioxidant can be employed for the purpose of eliminating the oxygen influence (oxygen functions as a polymerization inhibitor). An example of the compound functioning as an antioxidant is a compound having two or more mercapto groups.

A liquid having a function as an oxygen barrier can be arranged outside of the microcapsules in the light-sensitive layer. A concrete example of such a liquid is water.

The thermal polymerization initiators employable in the light-sensitive material are compounds which are decomposed under heating to generate polymerization initiating species, particularly a radical, and those generally employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexane-carbonitrile), dimethyl 2,2'-azobisisobutyrate, 2,2'-azobis(2-methylbutyronitrile) and azobisdi-methylvaleronitrile; organic peroxides, e.g., benzoyl peroxide, di-tert-butyl peroxide, dicumyl peroxide, tert butyl hydroxide and cumene hydroperoxide; inorganic peroxides, e.g., hydrogen peroxide, potassium persulfate, and ammonium persulfate; and sodium p-toluenesulfinate. The thermal polymerization initiator is preferably used in an amount of from 0.1 to 120% by weight, more preferably from 1 to 10% by weight, based on the amount of the polymerizable compound. In a system in which the polymerizable compound within the area where a latent image of the silver halide has not been formed is polymerized, the thermal polymerization initiator or the photopolymerization initiator is preferably incorporated into the light-sensitive layer.

The development stopping agents employable in the light-sensitive material are compounds to neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds and mercapto compounds. Examples of the acid precursors include oxide esters described in Japanese Patent Provisional Publications No. 60(1985)-108837 and No. 60-(1985) 192939 and compounds which release acids through Lossen rearrangement described in Japanese Patent Provisional Publication No. 60(1985)-230133.

The light-sensitive layer of the light-sensitive material may contain dyes or pigments for the purpose of anti-halation or anti-irradiation. A light-sensitive material can contain white pigments in the light-sensitive layer for the purpose of anti-halation or anti-irradiation.

The microcapsules dispersed in the light-sensitive layer can contain dye or pigment which is decolored upon heating or light-irradiation. The dye or pigment which decolors upon heating or light-irradiation serves as an yellow filter which is generally used in the conventional silver salt photographic system.

The antismudging agents employable in the light-sensitive material are preferably in the form of solid particles at ambient temperatures. Concrete examples of the anti-smudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean particle size of 3 to 50 $\mu$m, more preferably 5 to 40 $\mu$m. In the case that the oily droplets of the polymerizable compound are in the form of microcapsules, the particle size of the antismudging agent is preferably larger than that of the microcapsule.

The binder employable in the light-sensitive material can be contained in the light-sensitive layer singly or in combination. The binder preferably is a hydrophilic binder, and representative hydrophilic binders are transparent or semi-transparent binders. Examples of such binders include natural substances, such as gelatin, gelatin derivatives, cellulose derivatives, starch and gum arabic; and synthetic polymeric substances, such as water-soluble polyvinyl compounds, e.g., polyvinyl alcohol, polyvinyl pyrrolidone and acrylamide polymers. As other synthetic polymeric substances, there can also be employed vinyl compounds in the form of latex, which are particularly effective for increasing dimensional stability of photographic materials.

A photopolymerization initiator can be contained in the light-sensitive layer of the light-sensitive material for the purpose of polymerizing the polymerizable compound within the area where a latent image of the silver halide has not been formed or polymerizing the transferred unpolymerized polymerizable compound as well as the aforementioned thermal polymerization initiator.

When using a solvent for the polymerizable compound, the solvent is preferably contained in a microcapsule which is different from the microcapsule containing the polymerizable compound.

A water-soluble vinyl polymer can be adsorbed on the silver halide grains.

The light-sensitive layer of the light-sensitive material comprising the above-mentioned components preferably has a pH value of not more than 7.

Examples of auxiliary layers which can be optionally arranged on the light-sensitive layer include an image-receiving layer, a heating layer, an antistatic layer, an anti-curling layer, a peel layer, a cover sheet, a protective layer, a layer containing a base or a base precursor, a base barrier layer and an anti-halation layer (colored layer).

Instead of using an image-receiving material (described later), the image-receiving layer can be provided in the light-sensitive material to form an image on the image-receiving layer. The structure of the image-receiving layer provided in the light-sensitive material can be the same as that of the image-receiving material. Details of the image-receiving layer will be described later.

The process for the preparation of a light-sensitive material is described below.

Various processes can be employed for preparing a light-sensitive material. In a generally known process, a light-sensitive material can be prepared by dissolving, emulsifying or dispersing the components of the light-sensitive layer in an adequate solvent to obtain a coating solution, then applying the solution onto the aforementioned support, and drying the coated layer of the solution.

The coating solution can be generally obtained by preparing liquid compositions, each composition containing each component, and mixing those compositions with each other. Each of the liquid compositions may contain plural components. Some components of the light-sensitive layer can be directly added to the liquid composition, or may be added in the stage for the preparation of the coating solution or after the same stage. Further, a secondary composition can be prepared by emulsifying the oily (or aqueous) composition in an aqueous (or oily) medium to obtain the coating solution.

The light-sensitive material of the present invention is prepared according to a process comprising the steps of:
(1) dispersing the base precursor in water;
(2) emulsifying the resulting dispersion of the base precursor and a silver halide emulsion in a polymerizable compound;
(3) further emulsifying the resulting emulsion in an aqueous medium containing a nonionic water-soluble polymer;
(4) forming the shell of the microcapsules; and
(5) coating the obtained microcapsule dispersion on the support.

The reducing agent is added to one selected from the group consisting of water, the dispersion of the base precursor, the silver halide emulsion, a polymerizable compound to be contained in the light-sensitive microcapsule.

Processes for the preparation of the liquid composition and the coating solution are described below.

A silver halide emulsion can be prepared by any known processes such as an acid process, a neutral process or an ammonia process.

A soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts of the silver salt and the halogen salt to be added or the rate of their addition can be increased as described in Japanese Patent Provisional Publications No. 55(1980)-158124 and No. 55(1980)-158124, and U.S. Pat. No. 3,650,757.

The silver halide emulsion employable for the preparation of the light-sensitive material may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 58(1983)-136641. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as a protective colloid. Examples of the hydrophilic colloids include proteins (e.g., gelatin, gelatin derivatives, gelatin grafted with other polymers, albumin and casein), cellulose derivatives (e.g., hydroxyethyl cellulose, carboxymethyl cellulose and cellulose sulfate), saccharide derivatives (e.g., sodium alginate and starch derivatives), and a wide variety of synthetic hydrophilic polymers (e.g., polyvinyl alcohol, partially acetalized polyvinyl alcohol, poly-N-vinylpyrrolidone, polyacrylic acid, polymethacrylic acid, polyacrylamide, polyvinylimidazole, polyvinylpyrazole, and copolymers comprising monomers constituting these homopolymers). Among them, gelatin is most preferred. Examples of useful gelatin include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972).386) or sulfur-containing compound (see: Japanese Patent Provisional Publication No. 53(1987) 144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt such as iridium (III) or (IV) chloride and ammonium hexachloroiridate, or a water-soluble rhodium salt such as rhodium chloride can be employed.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, singly or in combination. Those chemical sensitization processes can be carried out in the presence of a nitrogen-containing heterocyclic compound.

When a sensitizing dye is added to the silver halide emulsion, the sensitizing dye is preferably added in the stage of preparation of the emulsion. When the nitrogen-containing heterocyclic compound functioning as an anti-fogging agent and/or a development accelerator is added to the silver halide emulsion, the compound is preferably added in the stage of the formation or ripening of the silver halide grains.

For introducing the organic silver salt into the light-sensitive layer, an emulsion of the organic silver salt can be prepared for a similar manner to that in the preparation of the silver halide emulsion. When emulsifying an aqueous dispersion of the base precursor in the polymerizable compound in the preparation of a light-sensitive material, the silver halide (including silver halide emulsion), the reducing agent and other optional components such as a color image-forming substance can be dissolved beforehand or emulsified in the polymerizable compound. Otherwise, they can be dissolved or emulsified in the polymerizable compound independently or simultaneously with emulsifying the aqueous dispersion of the base precursor. Further, a shell material required for encapsulation can be also incorporated into the polymerizable compound.

A light-sensitive composition containing the polymerizable compound and the silver halide can be prepared using a silver halide emulsion. The light-sensitive composition can be also prepared by a method of using a powdery silver halide obtained by freeze-drying other than a method of using the silver halide emulsion. The light-sensitive composition containing the silver halide can be obtained by stirring the components of the light-sensitive composition using a homogenizer, a blender, a mixer and other stirring devices conventionally used.

A copolymer consisting of hydrophilic repeating unit and hydrophobic repeating unit is preferably dissolved in the polymerizable compound employed in the preparation of the light-sensitive composition.

Instead of using the above copolymer, microcapsules containing the silver halide emulsion as a core material may be dissolved in the polymerizable compound to prepare the light-sensitive composition.

The polymerizable compound (or the light-sensitive composition containing other components) is preferably used in the form of an emulsion in which the polymerizable compound is emulsified in an aqueous medium. A shell material of the microcapsule can be added to the emulsion to form a shell of the microcapsule at this stage.

The emulsion of the polymerizable compound (including a microcapsule dispersion obtained by the above-mentioned process) is a light-sensitive composition containing the polymerizable compound and the silver halide, and the light-sensitive composition can be used per se as a coating solution for preparing a light-sensitive material. The light-sensitive composition may be mixed with other compositions such as an organic silver salt emulsion, to prepare a coating solution for preparing a light-sensitive material. To the coating solution can be added other optional components as in the case of adding to the above-mentioned emulsion.

The coating solution prepared as above is coated over a support, and the coated layer of the solution is dried to prepare a light-sensitive material. Coating or the solution on the support can be readily accomplished according to known processes.

Use of the light-sensitive material is described below.

In the use of the light-sensitive material the light-sensitive material is subjected to development processing simultaneously with or after imagewise exposure.

Various exposure means can be employed in the image-wise exposure, and in general, a latent image of the silver halide is obtained by imagewise exposure to radiation including visible light. The kind of light source or the amount of light employed in the exposure can be selected depending on a light-sensitive wavelength (or intensified wavelength in the case of spectral sensitization) of the silver halide and a sensitivity of the light-sensitive material. An original image can be either a monochromatic image or a color image.

Development of the light-sensitive material can be conducted simultaneously with or after the imagewise exposure. The light-sensitive material may be developed using a developing solution. Otherwise, the light-sensitive material may be developed by a heat development process. The heat development process has advantages of simple procedures and short processing time. Therefore, the latter process (heat development process) is preferred for development of the light-sensitive material.

Heating in the heat development process can be conducted in various known manners. A heating layer which is arranged on the light-sensitive material can be used as the heating means. The heat development process may be conducted while suppressing the amount of oxygen in the light-sensitive layer. The temperature for the heat development process usually ranges from 50° C. to 200° C., preferably from 60° C. to 150° C. The heating time is usually not shorter than 1 second, preferably from 1 second to 5 minutes, more preferably from 1 second to 1 minute.

The development process may be conducted by heating at a temperature of not lower than 50° C. under the condition that the light-sensitive layer contains a liquid in an amount of 10 to 400 wt.% based on the amount of the polymerizable compound.

The light-sensitive material is subjected to the above-mentioned heat development process to polymerize the polymerizable compound within the area where a latent image of the silver halide has been formed or the area where a latent image of the silver halide has not been formed. Generally, the polymerizable compound is polymerized within the area where a latent image of the silver halide has been formed in the heat development process. However, the polymerizable compound within the area where a latent image of the silver halide has not been formed can also be polymerized by adjusting the kind or the amount of the reducing agent.

Through the above-mentioned development process, a polymer image can be formed on the light-sensitive layer. A color image can be also obtained by fixing a dye or a pigment on the polymer image.

If the light-sensitive material contains two color image forming substances, one substance is contained in microcapsules, and the, other is arranged outside of the microcapsules. The light-sensitive material is pressed to rupture the microcapsules to bring two color image forming substances into contact with each other. Thus, a color image can be formed on the light-sensitive material.

An image-receiving material can be employed to form a image thereon. The image-receiving material employable in the image-forming method is described below.

As the support of the image-receiving material, there can be used a baryta paper in addition to various materials employable as a support of a light-sensitive material.

The image-receiving material generally has an image-receiving layer on the support. The image-receiving layer can be constructed using a variety of compounds according to the color formation system. If a dye or a pigment is used as the color image-forming substance in the case of forming a polymer image on the image-receiving material, the image-receiving material can be composed of the support only.

When a color formation system using a color former and a developer is employed, the developer can be contained in the image-receiving layer. Further, the image-receiving layer can be composed of at least one layer containing a mordant. The mordant can be selected from various compounds which are known in the photographic art in consideration of nature of the color image-forming substance. If desired, the image-receiving layer can be composed of two or more layers containing a plurality of mordants different from each other in the mordanting power.

The image-receiving layer preferably contains a polymer as a binder. The binder for the image-receiving layer can be selected from those employable for the aforementioned light-sensitive layer. A polymer having a low transmission coefficient of oxygen can also be used.

The image-receiving layer may contain a thermoplastic compound. In the case that the thermoplastic compound is contained in the image-receiving layer, the image-receiving layer itself is preferably composed of an agglomerate of fine particles of the thermoplastic compound (i.e., granular thermoplastic compound). The image-receiving layer having the above constitution is advantageous in that the formation of a transferred image can be readily accomplished and a glossy image can be obtained upon heating after the image formation. There is no specific limitation on the thermoplastic compounds, and any known thermoplastic resins (plastics) and waxes can be employed. The glass transition point of the thermoplastic resin or the melting point of the wax preferably is not higher than 200° C.

A photopolymerization initiator or a thermal polymerization initiator may be contained in the image-receiving layer. In the image-forming method using an image-receiving material, a color image-forming substance is transferred together with the unpolymerized polymerizable compound as described hereinafter, such that the photopolymerization initiator or the thermal polymerization initiator can be incorporated into the image-receiving layer to smoothly perform the curing procedure (fixing procedure) of the unpolymerized polymerizable compound.

A dye or a pigment may be contained in the image-receiving layer for the purpose of entering letters, symbols, and frames in the image-receiving layer, or for providing a certain color to the background of the image. Further, the dye or pigment can be also employed for the purpose of making it easy to distinguish the front and back surfaces of the image-receiving material. As the dye or the pigment, there can be used various known dyes or pigments employable for the image formation. However, in the case that the dye or pigment may disturb the resulting image formed on the image-receiving layer, it is preferred to make the density of the dye or pigment lower (e.g., reflection density of not higher than 1), or to use a dye or a pigment which decolors when it is heated or irradiated with light.

If a white pigment such as titanium dioxide and barium sulfate is contained in the image-receiving layer, the image-receiving layer can serve as a white reflection layer. In this case, the white pigment is preferably used in an amount of 10 to 100 g based on 1 g of the thermoplastic compound.

The above-mentioned dye or pigment can be either uniformly or locally contained in the image-receiving layer. For example, if the support is composed of a material having light transmission properties and the image-receiving layer locally contains the white pigment, a part of a reflection image can be made a projected image. In other words, image information which is unnecessary for the projected image can also be recorded as a reflection image on the image-receiving layer containing the white pigment.

The image-receiving layer can be composed of two or more layers depending on the above-mentioned functions. The thickness of the image-receiving layer preferably ranges from 1 to 100 μm, more preferably from 1 to 20 μm.

A protective layer can be provided on the image-receiving layer. A layer composed of an agglomerate of a granular thermoplastic compound can be also provided on the image-receiving layer.

Further, other various layers such as an adhesive layer, a layer containing an adhesive and a release paper can be laminated on the surface of the support not facing the image-receiving layer.

The light-sensitive material having been subjected to the aforementioned development process is pressed on the image-receiving material to transfer the unpolymerized polymerizable compound onto the image-receiving material, whereby a polymer image can be formed on the image-receiving material. Application of pressure on the light-sensitive material with the image-receiving material can be made according to various known methods.

In the case that the light-sensitive layer contains a color image-forming substance, the light-sensitive material is subjected to the heat development process to cure the polymerizable compound, and thereby the color image-forming substance in the cured portion is fixed. Then, the light-sensitive material is pressed on the image-receiving material to transfer the color image-forming substance in the uncured portion onto the image-receiving material. Thus, a color image can be formed on the image-receiving material.

After the image is formed on the image-receiving material by the above process, the image-receiving material can be heated to polymerize the unpolymerized polymerizable compound that was transferred onto the image-receiving material. Through the above-mentioned process, the obtained image can be improved in the preservability.

The present applicant has already applied for patents with respect to various image-recording apparatus which are suitably used in the above-described image-forming methods using a light-sensitive material. Representative examples of the apparatus include an apparatus comprising an exposure means for forming a latent image through imagewise exposure, a heat-development means for curing and fixing the polymerizable compound corresponding to the latent image and a transferring means for laminating the developed light-sensitive material on the image-receiving material and pressing the laminate; and an apparatus comprising the above structure and further comprising a fixing means for subjecting the image-receiving material having a transferred image thereon to at least one of a light-irradiation procedure, a pressing procedure and a heating procedure.

The light-sensitive material of the invention can be used for monochromatic or color photography, printing, radiography, medical diagnosis (e.g., CRT photography of diagnostic device using ultrasonic wave), or copy (e.g., computer-graphic hard copy).

The present invention is further described by the following examples.

In those examples, both cases of using a nonionic water-soluble polymer and using an anionic water-soluble polymer in the formation of a microcapsule shell is described in detail for the purpose of clarifying the effect of the invention, but those cases should not be construed as restricting the invention.

EXAMPLE 1

Preparation of Silver Halide Emulsion

In 1,200 ml of water were dissolved 25 g of gelatin and 1.2 g of sodium chloride, and the resulting gelatin solution was adjusted to pH 3.2 using 1N-sulfuric acid and was kept at 60° C. To the gelatin solution, 600 ml of an aqueous solution containing 117 g of potassium bromide and 600 ml of an aqueous solution containing 0.74 mole of silver nitrate were added simultaneously at the same feed rate over 15 minutes. After 1 minute, to the resulting mixture was added 47 ml of 1% methanol solution of the following sensitizing dye, and after 15 minutes, to the resulting mixture was further added 20 ml of an aqueous solution containing 4.3 g of potassium iodide at the same feed rate over 5 minutes. To the resulting emulsion was then added 1.2 g of polyisobutylene/monosodium maleate copolymer. After the emulsion was washed with water for desalting, 24 g of gelatin was added to the emulsion. Then, to the emulsion was further added 5 mg of sodium thiosulfate to chemically sensitize the emulsion at 60° C. for 15 minutes. Thus, a silver halide emulsion of yield of 100 g was prepared.

(Sensitizing dye)

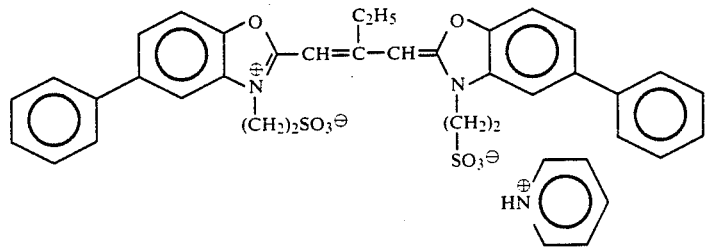

Preparation of Solid Dispersion (1) of Base Precursor

To 160 g of 3% aqueous solution of gelatin was added 40 g of the following base precursor (1), and the base precursor was dispersed in the solution using a Dinomill dispersing device to prepare a dispersion (1) of the solid base precursor.

(Base precursor (1))

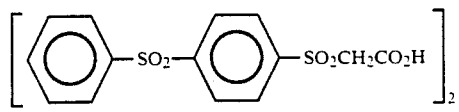

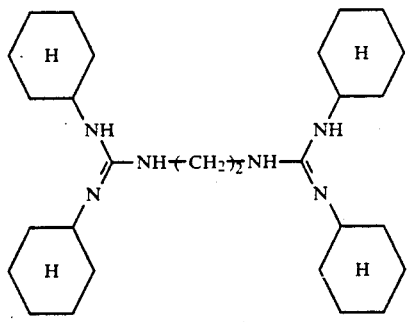

. Preparation of Light-Sensitive Composition (1)

In 100 g of the following polymerizable compound (tradename: Kayarad R-604, available from Nippon Kayaku Co., Ltd.) were dissolved 37 g of 10% solution of the following copolymer in propylene glycol monomethyl ether and 20 g of the following magenta color image forming substance. Then, in 51.6 g of the resulting solution were dissolved 2.42 g of the following reducing agent (I), 3.29 g of the following reducing agent (II) and 0.006 g of the following mercapto compound, to prepare an oily solution.

To the oily solution was then added 4.5 g of the above-obtained silver halide emulsion and 37.9 g of the above-obtained dispersion (1) of solid base precursor, and the resulting mixture was stirred at 15,000 r.p.m. for 5 minutes at 50° C. using a homogenizer to obtain a light-sensitive composition (1) in the form of a W/O emulsion.

(Polymerizable compound)

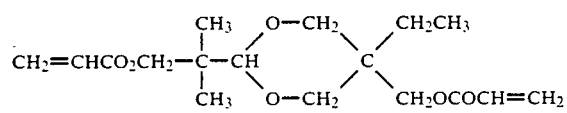

(Copolymer)

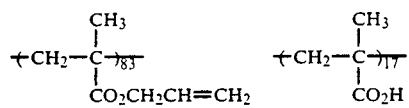

(Magenta color image forming substance)

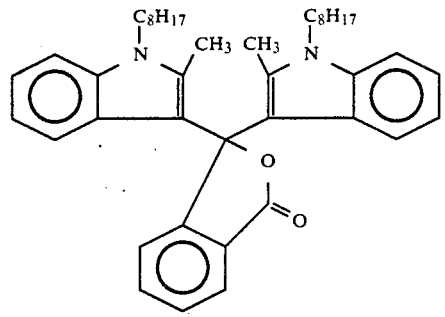

(Reducing agent (I))

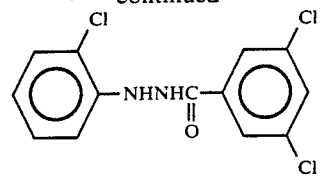

(Reducing agent (II))

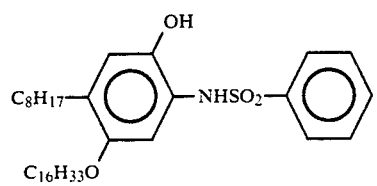

(Mercapto compound)

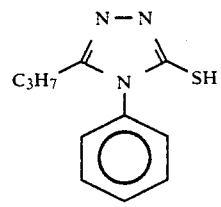

Preparation of Light-Sensitive Microcapsule Dispersion (1)

With 162 g of 7.1% aqueous solution of polyvinyl pyrrolidone (tradename: K-90, available from Wako Junyaku Industry Ltd.) was mixed 10.0 g of 15% aqueous solution of potassium polyvinylbenzenesulfinate, and the resulting mixture was adjusted to pH 5.0. To the mixture was then added the above-prepared light-sensitive composition (1), and the resulting mixture was stirred at 3,000 r.p.m. for 20 minutes at 50° C. using a dissolver to obtain a W/O/W emulsion.

Independently, to 14.8 g of melamine were added 20.0 g of 37% aqueous solution of formaldehyde and 76.3 g of distilled water, and the resulting mixture was stirred at 60° C. for 40 minutes to obtain a transparent aqueous solution of melamine-formaldehyde precondensate.

To the above-prepared W/O/W emulsion was added 69.3 g of the aqueous solution of the precondensate, and the resulting mixture was adjusted to pH 5.0 using 10% aqueous solution of sulfuric acid. The mixture was then heated to 60° C. and stirred for 120 minutes. Further, the mixture was adjusted to pH 6.5 using 10% aqueous solution of sodium hydroxide. Thus, a light-sensitive microcapsule dispersion (1) containing microcapsules having a melamine-formaldehyde resin shell was obtained.

Preparation of Light-Sensitive Material (1)

To 2.50 g of the above-obtained light-sensitive microcapsule dispersion (1) were added 0.33 g of 5% aqueous solution of Emalex NP.8 (tradename of Nippon Emulsion Co., Ltd.), 0.83 g of 20% aqueous dispersion of cornstarch and 3.19 g of distilled water, which was were well stirred to prepare a coating solution.

The coating solution was coated over a polyethylene terephthalate film (thickness: 100 μm) using a wire bar of #40, and the coated layer of the solution was dried at 40° C. for 1 hour to prepare a light-sensitive material (1) of the present invention.

EXAMPLE 2

Preparation of Light-Sensitive Material (2)

The procedures of Example 1 were repeated except for using the following base precursor (2) instead of the base precursor (1), to prepare a light-sensitive microcapsule dispersion (2) and a light-sensitive material (2) of the invention.

(Base precursor (2))

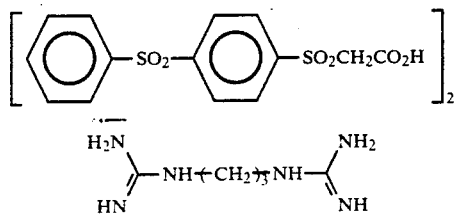

EXAMPLE 3

Preparation of Light-Sensitive Material (3)

The procedures of Example 1 were repeated except for using the following base precursor (3) instead of the base precursor (1), to prepare a light-sensitive microcapsule dispersion (3) and a light-sensitive material (3) of the invention.

(Base precursor (3))

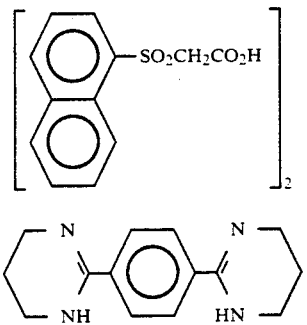

COMPARISON EXAMPLE 1

The procedures of Example 1 were repeated except for using 113 g of 10% aqueous solution of sodium polystyrene-sulfonate (tradename: Versa TL502, available from National Starch Co., Ltd.) instead of the mixture solution of the potassium polyvinylbenzenesulfinate and the polyvinyl pyrrolidone, to prepare a light-sensitive microcapsule dispersion (A) and a light-sensitive material (A) for comparison.

COMPARISON EXAMPLE 2

The procedures of Comparison Example 1 were repeated except for using the base precursor (2) instead of the base precursor (1), to prepare a light-sensitive microcapsule dispersion (B) and a light-sensitive material (B) for comparison.

COMPARISON EXAMPLE 3

The procedures of Comparison Example 1 were repeated except for using the base precursor (3) instead of the base precursor (1), to prepare a light-sensitive microcapsule dispersion (C) and a light-sensitive material (C) for comparison.

Preparation of Microcapsule Sample

To 3 g of each light-sensitive microcapsule dispersion obtained above were added 3.0 g of a coating solution for an image-receiving material (described later) and 1.5 g of distilled water, to prepare coating solution, each corresponding to each light-sensitive microcapsule dispersion. Each of the obtained coating solutions was coated over a polyethylene terephthalate film (thickness: 100 $\mu$m) in coating amount of 70 ml/m$^2$, and each of the coated solutions was dried at 40° C. for 1 hour to prepare samples corresponding to each light-sensitive microcapsule dispersion.

Evaluation of Denseness of Microcapsule Shell

Each of the obtained samples was measured for the color image density using a Macbeth reflection densitometer in the case of not heating each sample (that is, the sample was left at room temperature, i.e., 25° C.) and in the case of heating each sample at 125° C. or 140° C. (that is, the sample was heated by pressing it on a hot plate of the same temperature).

A color is given by the reaction of a color image-forming substance (leuco dye) contained in the core material of the microcapsule with a developer present outside of the microcapsule (developer contained in the coating solution for the formation of an image-receiving layer, i.e., zinc 3,5-di-$\alpha$-methylbenzylsalicylate). In the above evaluation, accordingly, a high density is given when the denseness of the shell is low, while a low density is given when the denseness of the shell is high.

The results are set forth in Table 1.

TABLE 1

| Microcapsule Dispersion | Protective Colloid | Base Precursor | Reflection Density Room Temp. | Reflection Density 125° C. | Reflection Density 140° C. | Relation to Present Application |
|---|---|---|---|---|---|---|
| 1 | Nonionic | (1) | 0.18 | 0.24 | 0.29 | Invention |
| 2 | Nonionic | (2) | 0.20 | 0.27 | 0.33 | Invention |
| 3 | Nonionic | (3) | 0.22 | 0.25 | 0.32 | Invention |
| A | Anionic | (1) | 0.37 | 0.56 | 0.77 | Comp. |
| B | Anionic | (2) | 0.41 | 0.50 | 0.74 | Comp. |
| C | Anionic | (3) | 0.40 | 0.55 | 0.82 | Comp. |

Remark:
Nonionic Colloid: Polyvinyl Pyrrolidone; and
Anionic Colloid: Sodium Polystyrenesulfonate As is evident from the results set forth in Table 1, the microcapsules (1 to 3) according to the invention prepared using a water-soluble nonionic polymer and a small amount of potassium polyvinylbenzenesulfinate in combination show a relatively low reflection density, whether the samples containing the microcapsules are heated (at 125° C. or 140° C.) or not heated (allowed to stand at room temperature). Therefore, it has been confirmed that the shell of the microcapsules according to the invention have a high denseness.

On the other hand, the microcapsules for comparison prepared using a large amount of a water-soluble anionic polymer as a protective colloid show a high reflection density. Therefore, it has been confirmed that the encapsulation reaction is inhibited by elution of the base precursor from the microcapsules. Namely, the shell of the microcapsules have a low denseness.

Preparation of Image-Receiving Material

To 125 g of water was added 11 g of 40% aqueous solution of sodium hexametaphosphate, and to the mixture were further added 34 g of zinc 3,5-di-α-methylvenzylsalicylate and 82 g of 55% slurry of calcium carbonate, followed by coarsely dispersing in a mixer. The resulting coarse dispersion was then finely dispersed in a Dynomill dispersing device. To 200 g of the resulting dispersion were added 6 g of 50% latex of SBR and 55 g of an 8% aqueous solution of polyvinyl alcohol, and the resulting mixture was made uniform to give a coating solution for the formation of an image-receiving layer. The coating solution was evenly coated on a baryta paper having a basis weight of 43 g/m$^2$ to give a coated layer of the solution having a wet thickness of 30 μm, and the coated layer was dried to prepare an image-receiving material.

Evaluation of Light-Sensitive Material

Each of the light-sensitive materials was imagewise exposed to light at 2,000 lux for 1 second using a halogen lamp over a continuous filter having a transmission density of 0 to 3.0, and then heated on a hot plate at 135° C. for 5 seconds, 10 seconds or 15 seconds.

Each of the light-sensitive materials was then placed on the image-receiving material, and the light-sensitive material with the image-receiving, material was passed through press rollers under a pressure of 500 kg/cm$^2$ to obtain a magenta positive image on the image-receiving material. The image obtained on the image-receiving material was measured on the maximum density and the minimum density using a Macbeth reflection densitometer.

The maximum density of an image becomes higher when the denseness of the microcapsule shell is low, because the core material oozes out of the microcapsules in the heating stage. On the contrary, the maximum image density becomes lower when the denseness of the microcapsule shell is high.

Further, the minimum density of an image becomes lower when the base precursor is firmly kept within the core material, because the development proceeds rapidly. On the contrary, the maximum image density becomes higher when the base precursor is eluted from the microcapsules and dissolved in the aqueous medium during the encapsulation stage.

The results are set forth in Table 2.

TABLE 2

| Light-sensitive Material | Protective Colloid | Base Precursor | Maximum Density (Heating Time (Sec.)) | | | Minimum Density (Heating Time (Sec.)) | | |
|---|---|---|---|---|---|---|---|---|
| | | | 5 | 10 | 15 | 5 | 10 | 15 |
| 1 | Nonionic | (1) | 1.38 | 1.36 | 1.32 | 0.14 | 0.09 | 0.08 |
| 2 | Nonionic | (2) | 1.38 | 1.35 | 1.29 | 0.21 | 0.11 | 0.10 |
| 3 | Nonionic | (3) | 1.40 | 1.36 | 1.28 | 0.17 | 0.12 | 0.09 |
| A | Anionic | (1) | 1.30 | 1.18 | 1.15 | 0.31 | 0.20 | 0.12 |
| B | Anionic | (2) | 1.27 | 1.19 | 1.12 | 0.36 | 0.19 | 0.15 |
| C | Anionic | (3) | 1.31 | 1.23 | 1.16 | 0.34 | 0.23 | 0.18 |

Remark:
Nonionic Colloid: Polyvinyl Pyrrolidone; and
Anionic Colloid: Sodium Polystyrenesulfonate As is evident from the results set forth in Table 2, the base precursor is firmly kept within the core material in the light-sensitive materials of the invention. Therefore, the light-sensitive materials were developed rapidly to give a lower minimum density. Further, as is expected from the results on the denseness set forth in Table 1, the microcapsules according to the invention are almost free from oozing of the core material at the development process because of the high denseness of the shell. Therefore, the light-sensitive material containing such microcapsules gives a higher maximum density.

Accordingly, it has been confirmed that the light-sensitive materials (1) to (3) can provide an image of high sharpness having a high maximum density and a low minimum density.

Evaluation of Mechanical Strength of Microcapsule Shell

A shell of a microcapsule contained in a light-sensitive material is sometimes ruptured by application of a pressure (approx. 10 kg/cm$^2$) in preparation of the light-sensitive material or in the handling thereof. The mechanical strength of the microcapsule shell against the pressure was measured in the following manner.

Each of the light-sensitive materials obtained above was imagewise exposed to light at 2,000 lux for 1 second using a halogen lamp over a continuous filter having a transmission density of 0 to 3.0, and then pressed at a pressure of 10 kg/c$^2$ using a static pressure testing machine. Each of the light-sensitive materials was then heated on a hot plate at 135° C. for 5 seconds, 10 seconds or 15 seconds.

Each of the light-sensitive materials was then placed on the image-receiving material, and the light-sensitive material with the image-receiving material was passed through press rollers under a pressure of 500 kg/c$^2$ to obtain a magenta positive image on the image-receiving material. The image obtained on the image-receiving material was measured for maximum density and the minimum density using a Macbeth reflection densitometer.

The maximum density of an image becomes lower when the microcapsule shell is ruptured by application of a pressure prior to heating the light-sensitive material and thereby the core material oozes out of the microcapsule at the heat development process. On the other hand, the maximum density becomes higher when the microcapsule shell is not ruptured.

Further, the minimum density of an image becomes higher in the case that the microcapsule shell is ruptured, because the polymerization reaction is inhibited by oxygen. On the contrary, the minimum density becomes lower when that the microcapsule shell is not ruptured.

The results are set forth in Table 3.

TABLE 3

| Light-sensitive Material | Protective Colloid | Base Precursor | Maximum Density (Heating Time (Sec.)) | | | Minimum Density (Heating Time (Sec.)) | | |
|---|---|---|---|---|---|---|---|---|
| | | | 5 | 10 | 15 | 5 | 10 | 15 |
| 1 | Nonionic | (1) | 1.34 | 1.30 | 1.28 | 0.18 | 0.10 | 0.08 |
| 2 | Nonionic | (2) | 1.38 | 1.32 | 1.25 | 0.24 | 0.19 | 0.10 |
| 3 | Nonionic | (3) | 1.35 | 1.27 | 1.21 | 0.20 | 0.14 | 0.09 |
| A | Anionic | (1) | 1.24 | 1.09 | 0.96 | 0.53 | 0.34 | 0.30 |
| B | Anionic | (2) | 1.18 | 1.04 | 0.88 | 0.54 | 0.41 | 0.32 |
| C | Anionic | (3) | 1.15 | 0.97 | 0.79 | 0.60 | 0.36 | 0.31 |

Remark:
Nonionic Colloid: Polyvinyl Pyrrolidone; and
Anionic Colloid: Sodium Polystyrenesulfonate As is evident from the results set forth in Table 3, the light-sensitive materials (1) to (3) of the present invention are excellent in the damage resistance and provide an image of high sharpness having a high maximum density and a low minimum density, since the shells of microcapsules contained in the light-sensitive materials of the invention are not ruptured even if a pressure is applied to the materials prior to the development process.

I claim:

1. A light-sensitive material comprising a support and a light-sensitive layer provided thereon which contains silver halide, a reducing agent, an ethylenically unsaturated polymerizable compound and a base precursor composed of a salt of a carboxylic acid with an organic base, said silver halide, reducing agent, polymerizable compound and base precursor being contained in microcapsules which are dispersed in the light-sensitive layer,
wherein the microcapsules are obtained by dispersing the base precursor in water, emulsifying the resulting dispersion in the polymerizable compound which functions as an oily phase, further emulsifying the resulting emulsion in an aqueous medium containing a nonionic water-soluble polymer and forming the shell of the microcapsules.

2. The light-sensitive material as claimed in claim 1, wherein the base precursor is dispersed in water in the presence of a nonionic water-soluble polymer or an amphoteric water-soluble polymer, and the dispersion is emulsified in the polymerizable compound.

3. The light-sensitive material as claimed in claim 1, wherein the nonionic water-soluble polymer is dissolved in the aqueous medium in an amount of 0.1 to 30% by weight.

4. The light-sensitive material as claimed in claim 2, wherein the nonionic water-soluble polymer or amphoteric water-soluble polymer is dissolved in water in an amount of 0.1 to 100% by weight based on the amount of the base precursor.

5. The light-sensitive material as claimed in claim 1, wherein the base precursor is dispersed in water in an amount of 5 to 60% by weight based on the total amount of the dispersion.

6. The light-sensitive material as claimed in claim 1, wherein the base precursor is contained in the light-sensitive layer in an amount of 2 to 50% by weight based on the amount of the polymerizable compound.

7. The light-sensitive material as claimed in claim 1, wherein the polymerizable compound is emulsified in the aqueous medium in an amount of 10 to 120% by weight based on the amount of the aqueous medium.

8. The light-sensitive material as claimed in claim 1, wherein an anionic water-soluble polymer in combination with the nonionic water-soluble polymer is dissolved in the aqueous medium.

9. The light-sensitive material as claimed in claim 8, wherein the amount of the anionic water-soluble polymer contained in the aqueous medium is in the range of 0.01 to 5% by weight.

10. The light-sensitive material as claimed in claim 1, wherein the base precursor is in the form of solid particles having a mean particle size in the range of 0.01 to 30 μm.

* * * * *